(12) United States Patent
Kim (10) Patent No.: US 7,329,878 B2
(45) Date of Patent: Feb. 12, 2008

(54) METHOD FOR MANUFACTURING A LENS ASSEMBLY OF MICROCOLUMN AND LENS ASSEMBLY OF MICROCOLUMN MANUFACTURED BY THE SAME

(75) Inventor: Ho Seob Kim, Cheonan-si (KR)

(73) Assignee: CEBT Co., Ltd., Asan-Si (KR)

( * ) Notice: Subject to any disclaimer, the term of this patent is extended or adjusted under 35 U.S.C. 154(b) by 148 days.

(21) Appl. No.: 10/565,373

(22) PCT Filed: Jul. 24, 2004

(86) PCT No.: PCT/KR2004/001841

§ 371 (c)(1),
(2), (4) Date: Jan. 20, 2006

(87) PCT Pub. No.: WO2005/010918

PCT Pub. Date: Feb. 3, 2005

(65) Prior Publication Data

US 2006/0255286 A1    Nov. 16, 2006

(30) Foreign Application Priority Data

Jul. 25, 2003    (KR) .................... 10-2003-0051474

(51) Int. Cl.
*H01J 37/26* (2006.01)
*G02B 7/02* (2006.01)
*G01N 23/00* (2006.01)
*G21K 7/00* (2006.01)

(52) U.S. Cl. ................. 250/396 R; 250/310; 250/311; 250/492.3; 313/251; 219/603; 373/85.1; 373/80; 373/86.1; 373/121.6; 373/121.63

(58) Field of Classification Search ............ 250/396 R; 219/121.63
See application file for complete search history.

(56) References Cited

U.S. PATENT DOCUMENTS

| | | | | |
|---|---|---|---|---|
| 5,122,663 | A * | 6/1992 | Chang et al. ............... | 250/310 |
| 6,195,214 | B1 * | 2/2001 | Muray et al. ............... | 359/819 |
| 6,281,508 | B1 * | 8/2001 | Lee et al. ............... | 250/396 R |
| 6,324,010 | B1 * | 11/2001 | Bowen et al. ............. | 359/622 |
| 6,369,385 | B1 * | 4/2002 | Muray et al. ............... | 250/306 |
| 2002/0125440 | A1 * | 9/2002 | Gmur ..................... | 250/396 R |
| 2005/0199821 | A1 * | 9/2005 | Saini et al. ................. | 250/398 |
| 2005/0199822 | A1 * | 9/2005 | Saini et al. ................. | 250/398 |
| 2006/0255286 | A1 * | 11/2006 | Kim .................... | 250/396 ML |

* cited by examiner

*Primary Examiner*—David A. Vanore
*Assistant Examiner*—Bernard Souw
(74) *Attorney, Agent, or Firm*—John K. Park; Park Law Firm (57) ABSTRACT

The present invention provides a method for manufacturing a lens assembly of a microcolumn having a plurality of microlenses and a plurality of insulating layers alternately interposed between the microlenses. The method includes forming at least one first microlens assembly set (set_1) by anodic-bonding an insulating layer (101) and a microlens (102) together; layering a second microlens assembly set (set_2) on the first microlens assembly set (set_1); and scanning a laser beam, thus welding the first microlens assembly set (set_1) to the microlens of the second microlens assembly set (set_2). The method of the present invention further includes anodic-bonding the microlens assembly sets together.

20 Claims, 6 Drawing Sheets

METHOD FOR MANUFACTURING A LENS ASSEMBLY OF MICROCOLUMN AND LENS ASSEMBLY OF MICROCOLUMN MANUFACTURED BY THE SAME

TECHNICAL FIELD

The present invention relates, in general, to methods for manufacturing lens assemblies for electron beam microcolumns and lens assemblies manufactured by the methods and, more particularly, to a method for manufacturing a lens assembly for an electron beam microcolumn and the lens assembly which has a high resolution and is elaborate and is used in electron beam lithography and in electron microscopes.

BACKGROUND ART

Electron emission sources operating under basic principles of scanning tunneling microscopes (STM) and electron beam microcolumns based on electron optical elements having microstructures were introduced in 1980. In electron beam microcolumns, microelements are elaborately assembled to minimize optical numerical values, thus forming improved electron columns. Furthermore, due to the microstructures, arrangements of a plurality of electron beam microcolumns are used in serial or parallel multi-electron columns.

The microcolumns are high-aspect-ratio micromechanical structures including microlenses and deflectors. Microlens assemblies constituting the microcolumns are multi-layered silicon chips (with membranes windows for lens electrodes), or silicon membranes which are spaced apart from each other by insulating layers each having a thickness of 100 to 150 μm. The microlens assemblies of the microcolumns include bores having diameters of a few to several hundred micrometers. For optimum performance, the roundness of the bores must be in the nanometer range and the alignment error between elements is required to be within a range of less than 1 μm.

Figure 1:
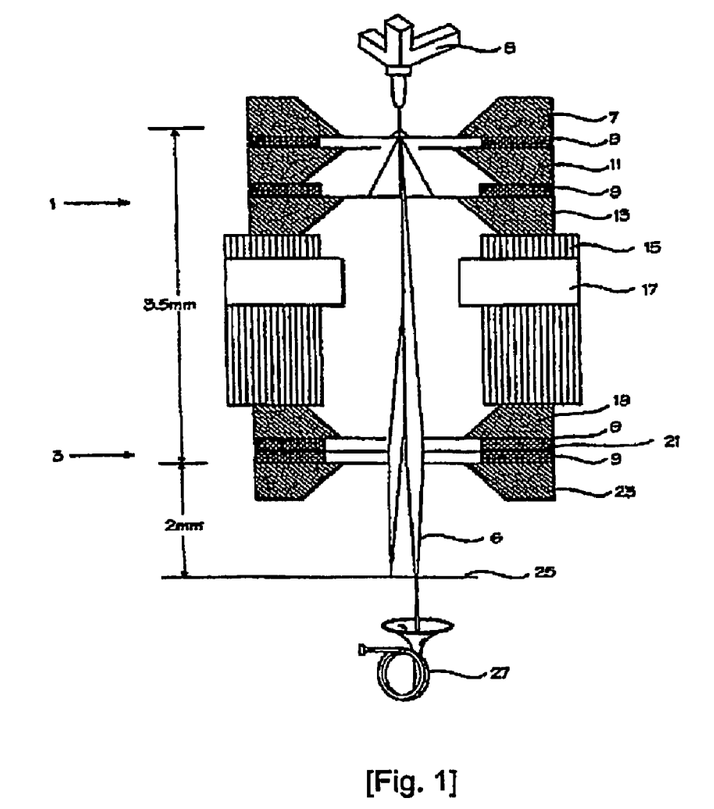
FIG. 1 is a sectional view of a general microcolumn.

FIG. 1 is a sectional view of a conventional 1 kV microcolumn based on the well-known STM aligned field emission (SAFE), showing a source lens part 1 and an Einzel lens part 3. An electron emission source 5, attached to a positioner of a scanning tunneling microscope (STM) type, emits an electron beam 6 toward a sample plane 25. The electron beam 6 first passes through the source lens 1, which is composed of silicon microlenses and, for example, an axially provided extractor 7 having a diameter of 5 μm, an accelerating electrode 11 having a 100 μm diameter hole, and a limiting aperture 13 with a 2.5 μm diameter hole. Three microlenses are separated by two insulating spacers 9. The insulating spacers 9 are preferably formed of Pyrex, but may be made of an insulating material, such as SD-2 glass made by Hoya. The source lens 1 is mounted on an aluminum base 15 having a deflector 17 which is composed of eight electrodes. Thereafter, the electron beam 6 passes through the Einzel lens 3. The Einzel lens 3 includes silicon microlenses 19 and 23 having 100 to 200 μm diameters. The silicon microlenses 19 and 23 each have at a center thereof a silicon hole unit 21 having a 1 to 2 μm thickness and a 1 mm×1 mm size. Silicon layers are separated by insulating spacers 9 to be spaced from each other at regular intervals. Thereafter, the electron beam 6 enters onto the sample plane 25 to emit a secondary electron. A channeltron detector 27 detects the secondary electron.

Figure 2:
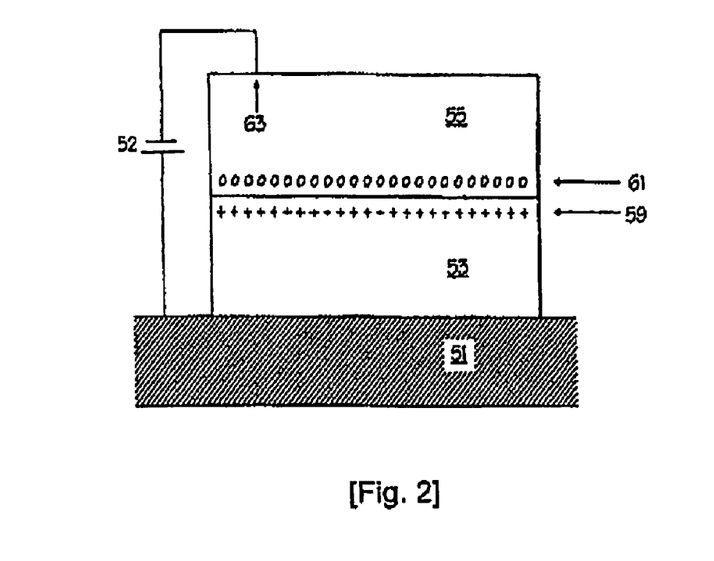
FIGS. 2 and 3 are views showing an anodic bonding process.
Figure 3:
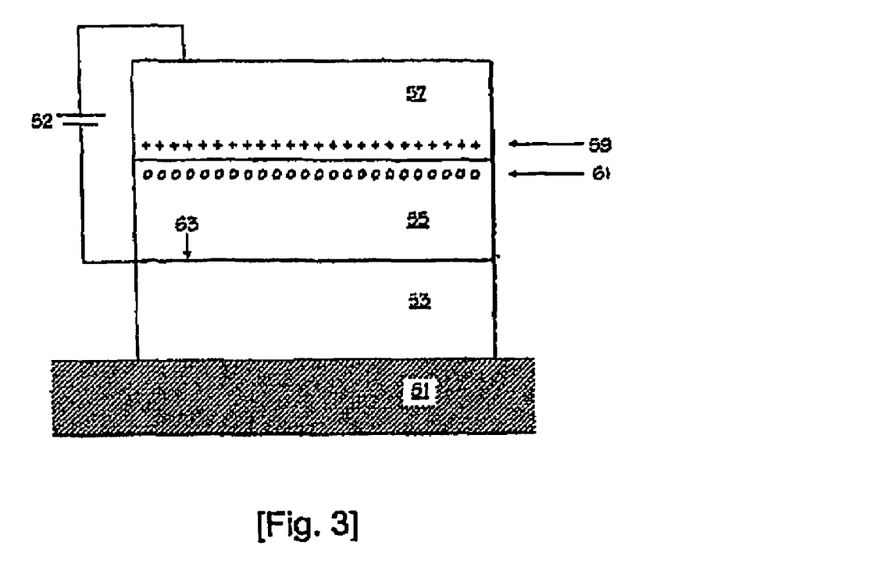

To assemble the lens assembly of the conventional microcolumn, the microlenses, made of silicon, and the insulating Pyrex spacers are sequentially layered one after another. Thereafter, the layered lenses and insulating materials are anodic-bonded together. The anodic-bonding is an electrochemical process of coupling glass to metal and semiconductors, as shown in FIGS. 2 and 3. At high-temperature (300-600° C.), sodium and oxygen ions of $Na_2O$ in the Pyrex or other glass are activated. When an electric field is formed by applying voltage, supplied from a voltage source 52, between a silicon microlens layer 53 and a glass insulating layer 55, sodium ions in the glass migrate from an interface in a direction shown by the arrow 63. Oxygen anions 61 move toward an induced positive charge 59 in a silicon anode to form chemical bonds.

This process was previously used for single sided bonding only. However, recently, this process has been extended to multilayer bonding. After the first silicon-to-glass bond, another silicon chip or membrane may be bonded to the free surface of the glass by reversing the applied voltage, as shown in FIG. 3. In this case, a second silicon layer 57 is placed on the glass insulating layer 55, while an opposite voltage is applied by the voltage source 52. At this time, the induced positive charge 59 moves the sodium ions in a direction indicated by the arrow 63 such that the oxygen anions 61 form chemical bonds with the second silicon layer 57. To achieve satisfactory multilayer bonding, controlling the temperature, the applied voltage, the bonding time, and, particularly, the surface condition of the layers is very significant.

However, the above-mentioned anodic bonding is executed after a plurality of microlenses and insulating layers are alternately layered. Therefore, while a layered product of the lens assembly of the microcolumn, which requires high accuracy in alignment, is heated to a high temperature and cooled, the layers may become misaligned, and thereby, the accuracy may be deteriorated. Furthermore, for the anodic bonding, an upper electrode is connected into a contact point type using a wire. Accordingly, an excessively long time is required to anodic-bond the lens assembly through the whole area using wire voltage.

In addition to the above-mentioned assembling method, a lens assembly of a microcolumn using laser spot bonding was proposed in Korean Patent Application No. 2001-7003679 (Filed: 22 Mar. 2001), which will be described herein with reference to FIG. 4 and will be quoted in the description of the present invention.

Figure 4:
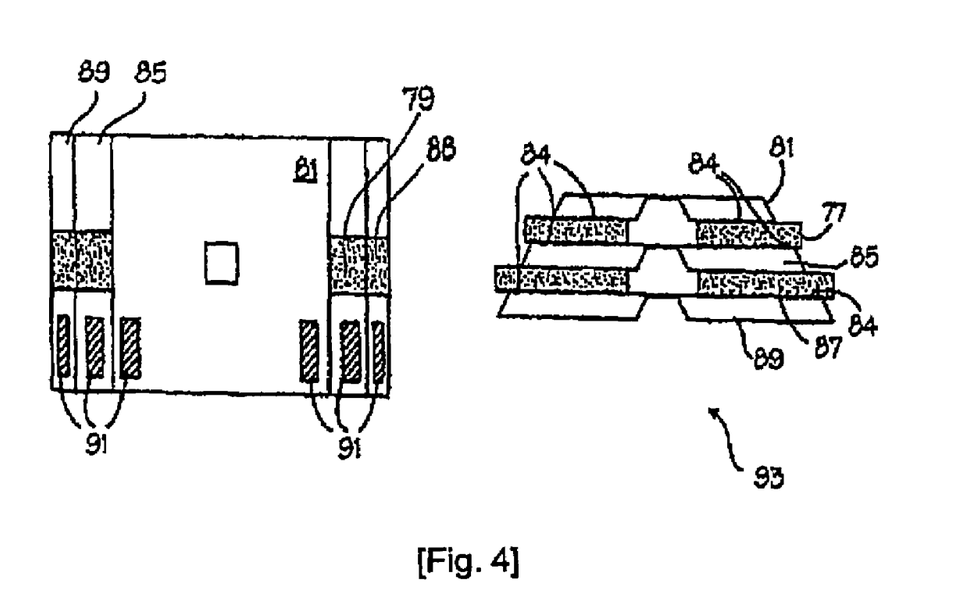
FIG. 4 shows plan and side views of a lens assembly assembled through laser spot bonding, according to a conventional technology.

FIG. 4 illustrates a lens assembly 93 of a microcolumn spot bonded by a laser, in which three microlenses 81, 85 and 89 and two insulating layers 77 and 87 are alternately layered.

In the lens assembly 93, the first insulating layer 77 and the second insulating layer 87 each have two extension parts which horizontally protrude outwards from opposite edges of each of the first insulating layer 77 and the second insulating layer 87. That is, the first insulating layer 77 and the second insulating layer 87 have ear parts 79 and 88, respectively. Because a microlens aperture of the microcolumn has a diameter of 2 μm or less, it is imperative that multiple layers of the microcolumn be precisely aligned.

When a laser beam is emitted from a laser, the laser beam substantially passes through the first insulating layer 77 to heat a surface of the second microlens 85. Thus, the first insulating layer and the surface of the microlens are instantaneously welded together. In the same manner, due to the laser beam passing through parts 84 to be welded, a surface of the second insulating layer 87 is instantaneously welded.

In other words, while silicon of the microlenses is melted at a high temperature and, thereafter, recrystallized, an adjacent portion of the insulating layer is heated. At approximately 400 to 500° C., the glass insulating layer begins to flow. At this time, a micro-weld of approximately 100 µm-500 µm in diameter is formed between two layers at the location of a laser spot weld or micro-weld 84.

DISCLOSURE

[Technical Problem]

However, in the case of the lens assembly of the microcolumn spot-bonded by the laser through the above-mentioned method, the lens assembly is maintained only by the welding parts 84 welded by the laser. Therefore, the lens assembly is problematic in that difficulty in maintenance of the arrangement exists, thus reducing stability. Furthermore, the lens assembly is problematic in that each insulating layer must have the ear part 79, 88 to provide a separate portion for laser welding.

In addition, it is disadvantageous in that an action of layering the lenses using the designated portions (ear parts) must be sequentially executed from the bottom.

[Technical Solution]

Accordingly, the present invention has been made keeping in mind the above problems occurring in the prior art, and an object of the present invention is to provide a method for manufacturing a lens assembly of a microcolumn and the lens assembly, in which a microlens assembly set is formed by anodic-bonding a microlens and an insulating layer together in a preliminary process, so that bonding between two layers is stable, thus reducing assembling time.

Another object of the present invention is to provide a method for manufacturing a lens assembly of a microcolumn and the lens assembly, in which the lens assembly of the microcolumn is formed by layering a plurality of microlens assembly sets, while spot bonding is executed by a laser to easily assemble the microlens assembly sets and, thereafter, anodic bonding is executed to provide the firm bonding, thus enhancing the stability of the lens assembly.

A further object of the present invention is to provide a method for manufacturing a lens assembly of a microcolumn and the lens assembly, which ensures a wire path connected to each microlens and a stable wire connection, and is regardless of the order of layering microlenses, thus increasing the productivity of the lens assembly process.

[Advantageous Effects]

The present invention provides a lens assembly of a microcolumn, in which a plurality of microlens assembly sets is first prepared and, thereafter, the microlens assembly sets are simply layered on top of another, thus reducing the time required for layering the microlens assembly sets.

In the present invention, a microlens and an insulating layer constituting each microlens assembly set are bonded together while the microlens is rotated on the insulating layer at a predetermined angle. Furthermore, the microlens assembly sets also are layered on top of one another while being rotated on each other at predetermined angles. Thus, laser spot bonding for maintenance of the arrangement can be easily executed. In addition, a laser beam can be simply scanned in a desired direction.

Moreover, because anodic bonding is executed using a flat plate electrode, the arrangement of the bonded layers is stably maintained and, as well, the time for the anodic bonding is reduced.

Although the preferred embodiments of the present invention will be explained for illustrative purposes, those skilled in the art will appreciate that various modifications, additions and substitutions are possible, without departing from the scope and spirit of the invention as disclosed in the accompanying claims.

BEST MODE

In an aspect, the present invention provides a method for manufacturing a lens assembly of an electron beam microcolumn having a plurality of microlenses each provided with a hole at a central position thereof, and a plurality of insulating layers alternately interposed between the microlenses. The method includes: forming at least one first microlens assembly set by anodic-bonding an insulating layer and a microlens together so that a part of a surface of the insulating layer is not covered by the microlens; layering the first microlens assembly set on a second microlens or a second microlens assembly set while aligning the holes of the microlenses, so that the second microlens or the microlens of the second microlens assembly set is in contact with the insulating layer of the first microlens assembly set, while the part of the insulating layer of the first microlens assembly set, not covered with the first microlens, is in contact with the second microlens or the microlens of the second microlens assembly set; and scanning a laser beam to bond the part of the insulating layer of the first microlens assembly set, not covered with the first microlens, to the second microlens or the microlens of the second microlens assembly set by passing the laser beam through the part of the insulating layer of the first microlens assembly set, thus welding the first microlens assembly set to the second microlens or the microlens of the second microlens assembly set.

In another aspect, the lens assembly of the present invention manufactured through the above-mentioned method, includes a first microlens assembly set formed by anodic-bonding a microlens and an insulating layer together, so that a plurality of microlens assembly sets is laser-spot-bonded together by the scanning of a laser beam in a predetermined direction while a welding spot is formed between the insulating layer of the first microlens assembly set and a microlens of a second microlens assembly set.

[Mode for Invention]

Hereinafter, a method for manufacturing a lens assembly of an electron beam microcolumn will be described.

First, the method for manufacturing the lens assembly of the electron beam microcolumn according to the present invention is as follows in brief. A microlens assembly set is formed by anodic-bonding a microlens and an insulating layer together using a flat plate electrode. Such microlens assembly sets are layered on top of another. Spot bonding using a laser is executed to bond the layered microlens assembly sets together. Thereafter, anodic bonding is executed to more stably bond the layered microlens assembly sets bonded together by the spot bonding.

Figure 5:
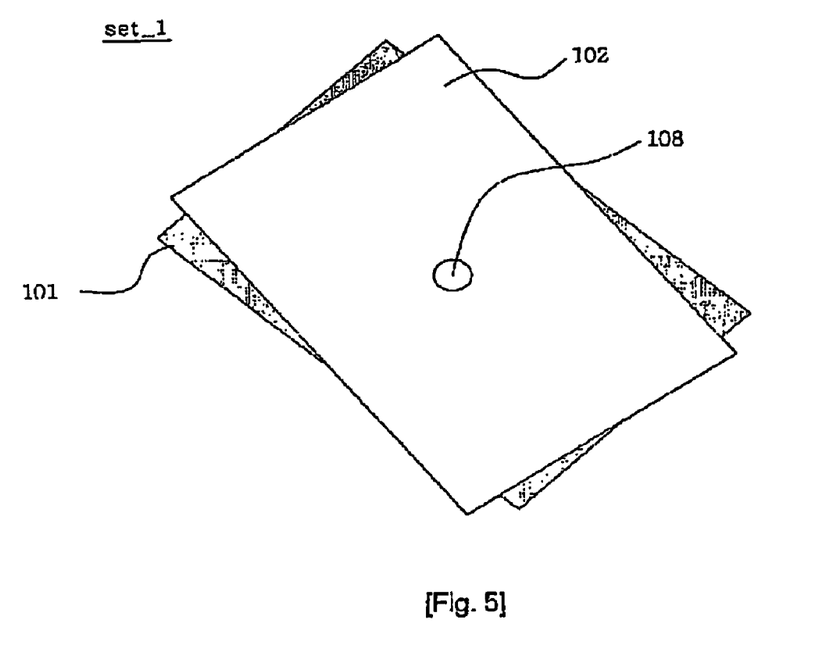
FIG. 5 is a plan view of a microlens assembly set, according to a first embodiment of the present invention, in which a microlens is slightly rotated on an insulating layer.
Figure 7:
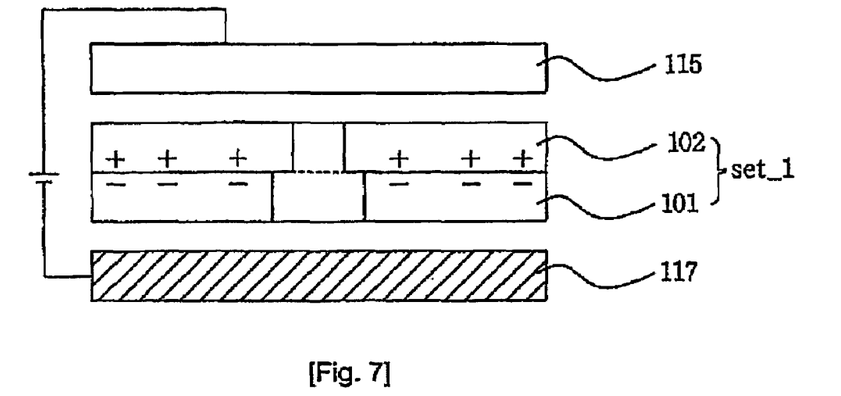
FIG. 7 is a side view showing a process of bonding the microlens to the insulating layer to form the microlens assembly set of FIG. 5.

As shown in FIGS. 5 and 7, according to the preferred embodiment, a first microlens assembly set set_1 is formed. In detail, a microlens 102 and an insulating layer 101, which each comprise planar plates of the same size having a rectangular or square shape, are layered on top of one another while the microlens 102 is rotated on the insulating layer 101 at a predetermined angle, for example, at an angle of 45° C. or less. Thereafter, the layered microlens 102 and insulating layer 101 are anodic-bonded together using a flat plate electrode, thus forming the first microlens assembly set set_1.

The anodic bonding of the first microlens assembly set set_1 will be explained in detail. As shown in FIG. 7, when voltage is applied, induced positive charges of a silicon microlens layer, which is placed on an anode support 117, is chemical-bonded to oxygen anions of the glass insulating layer which are generated by a flat plate electrode 115 placed on the first microlens assembly set set_1. At this time, an upper anode flat plate 115 is maintained in a contact state to rapidly bond the microlens in a precise arrangement, and simultaneously, the flat plate electrode 117 having a wide surface area applies anode voltage. In the preferred embodiment of the present invention, the wide contact is possible by using the flat plate electrode 115. Furthermore, by applying voltage through a wide area, a processing time of the anodic bonding is significantly reduced, compared with conventional anodic bonding using a wire electrode. In addition, the anodic bonding can be stably executed.

At this time, the microlens and the insulating layer are arranged while aligning circular holes 108 which are provided at central positions on the microlens and the insulating layer. The holes 108 are used as a path for scanning an electron beam in the lens assembly of the completed microcolumn. Typically, the arrangement of the holes of the lens assembly of the microcolumn means the alignment of the holes of microlenses. The holes of the insulating layers are larger than the holes of the microlenses. Therefore, the hole arrangement of the microlens assembly set is formed in a short time, unlike the hole arrangement of the microlenses. That is, the holes of the microlens and the holes of the insulating layers can be aligned with the naked eye. After the arrangement of the holes, the anodic bonding is directly executed. As such, the formation of the microlens assembly set is attained in a short time.

Figure 6:
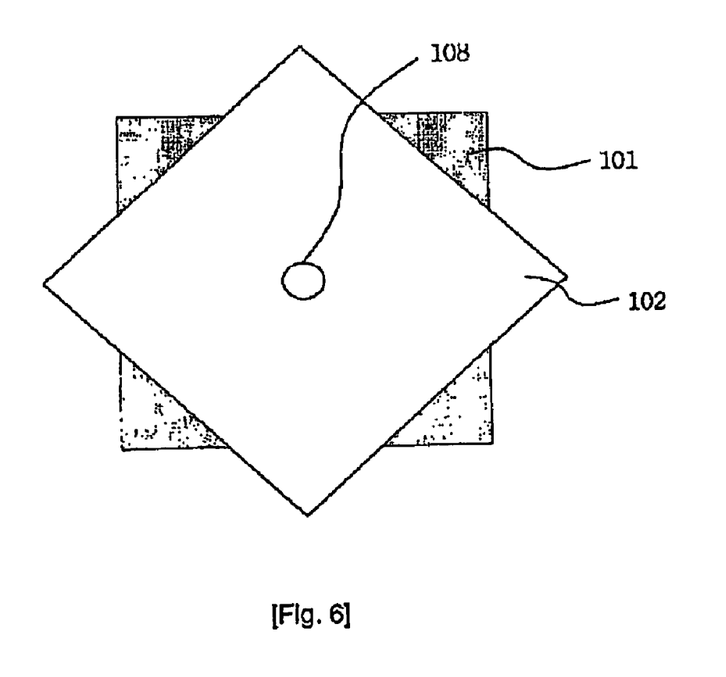
FIG. 6 is a plan view of a microlens assembly set, according to a second embodiment of the present invention, in which a microlens is rotated on an insulating layer at an angle of 45°.

The description of the rotating angle is as follows. Each layer is rotated on a neighboring layer around each hole 108 at a predetermined angle to expose a predetermined portion to the outside, thus forming a passage of a laser beam during a laser spot bonding which will be described later herein. In the case of a rotating angle of 45°, as shown in FIG. 6, because the rotating angle is relatively large, sufficiently wide portions, on which welding spots are formed for laser spot bonding, are formed on each layer. In the case of FIG. 6, it is preferable that both the layering of the microlens assembly sets and the laser spot bonding are sequentially executed in the predetermined direction.

In the case of a small rotating angle, as shown in FIG. 5, portions exposed to form welding spots for the laser beam are smaller than those of the case of FIG. 6. Therefore, it may be difficult to arrange the microlens assembly sets to execute the laser spot bonding. However, the advantage of the case of FIG. 5 is that a greater number of microlens assembly sets can be layered on top of one another and integrally treated by the laser spot bonding. If there are few microlens assembly sets, the provided portions for the laser spot bonding will be sufficient.

As such, after the microlens assembly sets are prepared, a desired number of microlens assembly sets are layered on top of one another to manufacture a lens assembly of a microcolumn which has a predetermined thickness. According to the embodiment of the present invention, referring to FIGS. 8 and 9, a second microlens assembly set set_2 is layered on the first microlens assembly set set_1. At this time, the first and second microlens assembly sets set_1 and set_2 are arranged while the first microlens assembly set set_1 is rotated on the second microlens assembly set set_2 at the same angle and in the same direction as microlens 102 and 104 are rotated on insulating layers 101 and 103, at an angle of 45° or less. Thereafter, laser spot bonding is executed to maintain the arrangement between the first and second microlens assembly sets set_1 and set_2.

Figure 8:
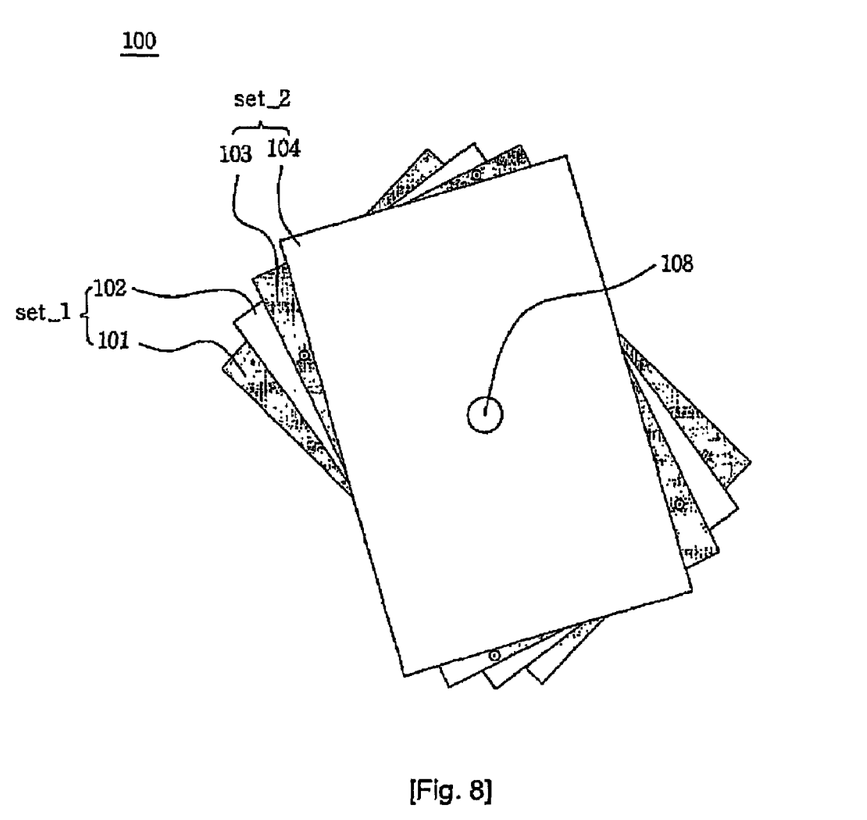
FIG. 8 is a plan view of two microlens assembly sets bonded together, according to the present invention.
Figure 9:
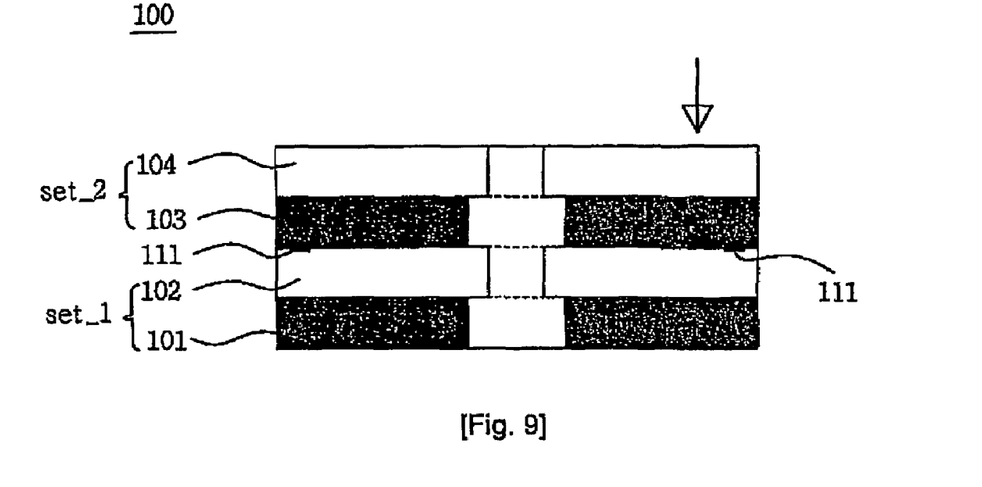
FIG. 9 is a side view of the two bonded microlens assembly sets of FIG. 8.

When laser beams are scanned in a direction of the arrow of FIG. 9 at predetermined positions that are designated by reference marks '⊗' of FIG. 8, the laser beams pass through the transparent insulating layer 103 of the second microlens assembly set set_2. Then, the laser beams reach the microlens 102 of the first microlens assembly set set_1. Due to the laser beams, laser spot bonding is executed at four spots. Due to the laser spot bonding, the arrangement of the first and second microlens assembly set set_1 and set_2 is stably maintained.

Furthermore, layering of the embodiment of FIG. 6 is simpler (not shown). In detail, first and second microlens assembly sets set_1 and set_2 are layered on top of one another such that each insulating layer and each microlens are nearly aligned with each other, unlike the embodiment of FIG. 8. Then, the portions to be scanned by the laser beam are widely formed, so that the arrangement of the first and second microlens assembly sets set_1 and set_2 is easy. In other words, the first and second microlens assembly sets set_1 and set_2 are layered on top of anther such that the microlens of the first microlens assembly set set_1 and the microlens of the second microlens assembly set set_2 cross at an angle of 45°. Continuously, in the same manner, more microlens assembly sets can be easily layered.

Figure 10:
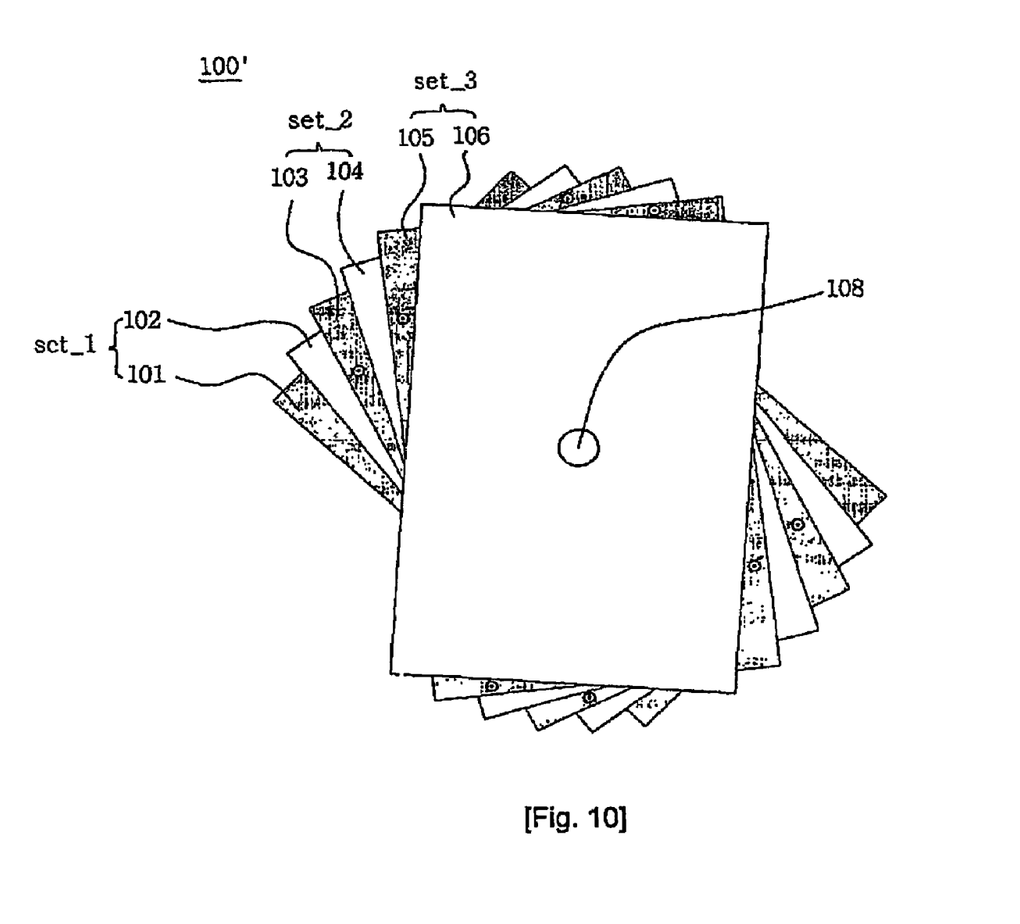
FIG. 10 is a plan view of three microlens assembly sets bonded together, according to the present invention.
Figure 11:
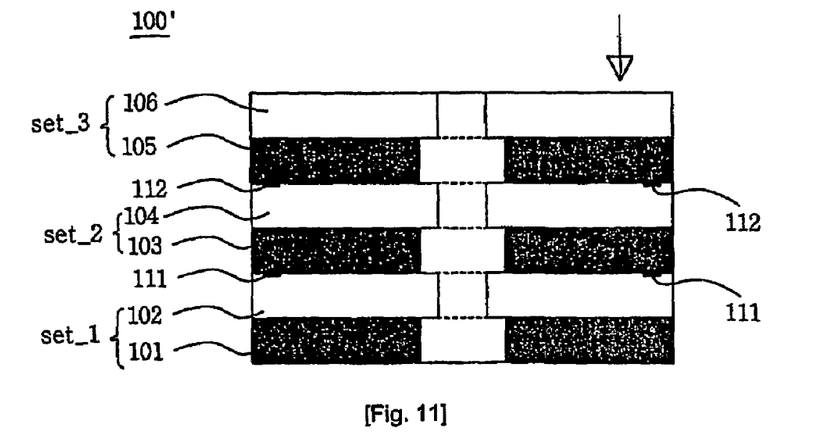
FIG. 11 is a side view of the three bonded microlens assembly sets of FIG. 10.

As shown in FIGS. 10 and 11, three microlens assembly sets set_1, set_2 and set_3 are layered on top of one another while each microlens assembly set is rotated on a neighboring microlens assembly set around holes 108 at a predetermined angle, in the same manner as that described for the arrangement of the two microlens assembly sets set_1 and set_2. Thereafter, when laser beams are scanned in the direction of the arrow of FIG. 11 at predetermined positions that are designated by reference marks '⊗' of FIG. 10, both an insulating layer 105 of the third microlens assembly set set_3 and a microlens 104 of the second microlens assembly set set_2 form four welding spots 112 during the laser spot bonding. As well, both an insulating layer 103 of the second microlens assembly set set_2 and a microlens 102 of the first microlens assembly set set_1 form other welding spots 112 at four positions. Thus, the three microlens assembly sets set_1, set_2 and set_3 are bonded together. Substantially, the number of welding spot is not limited to four, but may be more or less, as the occasion demands. That is, the number of the welding spots can be selected such that the arrangement of bonded microlens assembly sets is not scattered.

Figure 12:
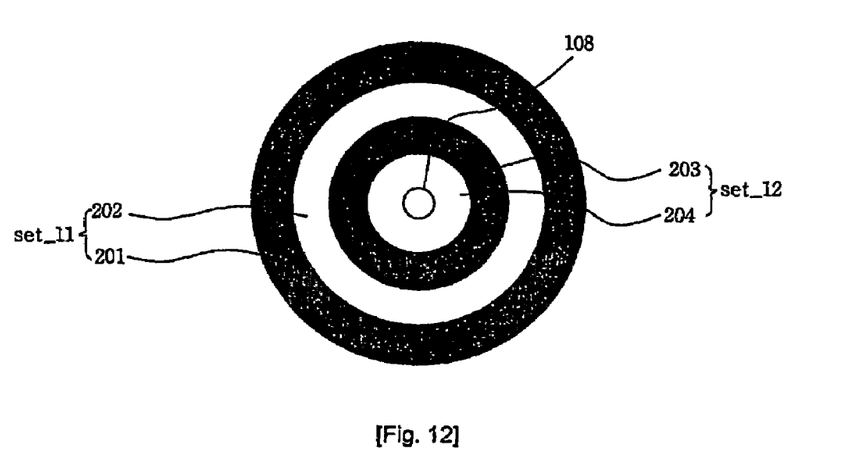
FIG. 12 is a plan view of a lens assembly formed by layering a plurality of circular microlens assembly sets reducing in diameter from the bottom one to the top one, according to a modification of the present invention.

A method of layering circular microlenses and circular insulating layers on top of one another is shown in FIG. 12, according to a modification of the embodiment. In this modification, a microlens assembly set is previously prepared in the same manner as that of the above-mentioned embodiments. However, the microlens assembly set has circular shape, so that it is unnecessary to rotate the microlens assembly set on another microlens assembly set for the arrangement. Merely, because the microlens assembly sets are layered while reducing in diameter from the bottom one to the top one in a pyramidal shape, exposed portions to receive laser beams are formed as shown in FIG. 12. Therefore, in this case, sizes of each circular microlens and each circular insulating layer are previously set according to the order of layering them in a step of manufacturing the microlens assembly sets.

In the meantime, after the lens assembly is completed by laser-spot-bonding the first, second and third microlens assembly sets set_1, set_2 and set_3, the whole microlens assembly sets set_1, set_2 and set_3 may be anodic-bonded using electrodes placed on upper and lower surfaces of the lens assembly, thus enhancing bonding force.

Furthermore, in the lens assembly, to apply a desired bonding force to the microlens assembly sets through laser spot bonding, it is necessary to layer the microlens assembly sets such that a microlens is placed at each of the uppermost and lowermost layers. To achieve the above-mentioned purpose, a microlens is placed at the lowermost layer in place of the microlens assembly set. If the uppermost layer is an insulating layer, a microlens is placed at the uppermost layer in place of the microlens assembly set. In other words, in the embodiment of FIGS. 8 and 9 or FIGS. 10 and 11, the microlens assembly set set_1 and/or set_3 is replaced with a new microlens to achieve the above-mentioned purpose. In the same manner, in the embodiments of FIGS. 6 and 12, the above-mentioned purpose can also be achieved.

Additionally, the insulating layers and the microlenses are layered on top of one another while being rotated on each other in the same direction and at the same angle, such that the microlenses are placed at the uppermost and lowermost layers. Thereafter, the layered lens assembly is anodic-bonded. Alternatively, a separately manufactured microlens assembly set, in which an insulating layer is interposed between two microlenses, may be used to form the lens assembly of the microcolumn. That is, a microlens assembly set is not limited to being formed by bonding one microlens and one insulating layer together in a preliminary step. Unimportant portions in the hole arrangement may be arranged in advance to form the microlens assembly set by a single anodic bonding process. However, in the case that the hole arrangement is important, it is preferable that the insulating layer and the microlens are preliminarily anodic-bonded.

In the preferred embodiments of the present invention, both the microlens 102, 104, 106, 302, 202, 204 and the insulating layer 101, 103, 105, 301, 201, 203 have holes 108. Each hole 108 has a circular shape for ease of maintenance of the arrangement of the lens assembly. In detail, although each layer is rotated on a neighboring layer, because the holes 108 have a circular shape, the arrangement of the layers is stably maintained. As such, each hole 108 has a circular shape to prevent a rotating axis of the layers from undesirably shaking while the layers are rotated. The above-mentioned hole is provided according to the preferred embodiment of the present invention. However, the hole is not limited to a circular shape, but may have a polygonal shape, such as a triangular or rectangular shape. In the case of an equilateral polygonal hole, a microlens is layered on an insulating layer such that a polygonal hole of the microlens and a polygonal hole of the insulating layer correspond in shape to each other. Of course, microlens assembly sets are layered on top of one another so that polygonal holes of the microlens assembly sets correspond in shape to each other. In other words, the microlens assembly sets are arranged such that those polygonal holes correspond in shape to each other from the uppermost microlens to the lowermost rotated microlens. Thus, a laser beam can pass through the polygonal holes of the layered microlens assembly sets in the same manner as through those of the microlens assembly sets having the circular holes.

Figure 13:
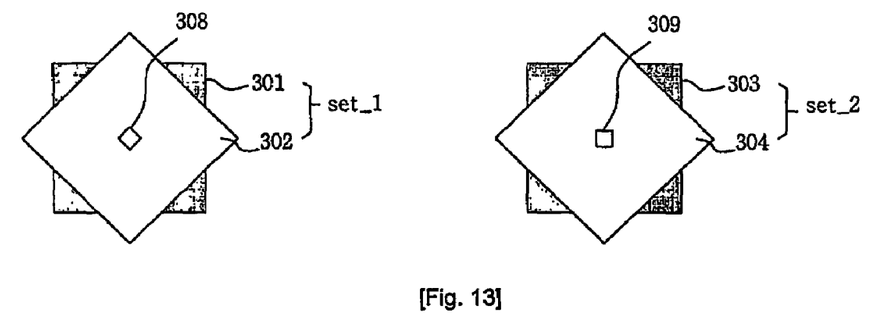
FIG. 13 is a plan view of two microlens assembly sets which are bonded together and each have a microlens with a rectangular hole, according to a modification of the present invention.

With reference to an embodiment of FIG. 13, there is a phase angle difference of 45° between a square hole 308 of a microlens 302 of a first microlens assembly set set_1 and a square hole 309 of a microlens 304 of a second microlens assembly set set_2. Thus, when the microlens 302 of the first microlens assembly set set_1 and an insulating layer 303 of the second microlens assembly set set_2 are aligned with each other, the square holes 308 and 309 correspond to each other to allow laser spot bonding. To layer a plurality of microlens assembly sets, a plurality of first and second microlens assembly sets set_1 and set_2 is previously prepared. Thereafter, first and second microlens assembly sets set_1 and set_2 are alternately layered, in which each first microlens assembly set set_1 is layered on each second microlens assembly set set_2.

Furthermore, in the case that a hole also has a triangular or polygonal shape, a predetermined angle, at which microlens assembly sets are rotated on each other, is previously determined. According to the determined angle, holes with a predetermined phase angle difference are formed on microlenses of the microlens assembly sets. Then, the microlens assembly sets can be layered on top of another in the same manner as that of the above-mentioned layering method. However, preferably, the holes have the phase angle difference equal to that of the embodiment of FIG. 13. In the arrangement of the hole of each microlens, if it is necessary to arrange the microlenses to be rotated at different angles, holes with different phase angle differences are formed on the microlenses. In addition, in the case that the hole does not have the equilateral polygonal shape but has an irregular polygonal shape, such as a rectangular shape, holes with a phase angle difference of 45° are previously formed on microlenses of first and second microlens assembly sets, in the same manner as that of the embodiment of FIG. 13.

Then, the microlens assembly sets can be layered on top of another in the same manner as that of the above-mentioned layering method.

Moreover, in the embodiment of FIG. 12, because the microlens assembly sets are not rotated, the microlens assembly sets can be layered on top of one another regardless of the shape of the holes of the microlenses.

In the embodiments of the present invention, although the bond of three or less microlens assembly sets set_1, set_2 and set_3 has been explained, more microlens assembly sets may be layered and bonded together in the same manner.

In the method for manufacturing the microlens and the lens assembly according to the present invention, a conventional wire path connected to each lens may be formed on the portions of each microlens, on which the laser spot bonding is executed. Thus, a stable wire connection is ensured. In other words, the wiring is accomplished using a conventional deposited gold pad on the microlens' portions for the laser spot bonding. Therefore, the wiring connection is physically and electrically stable. The wire path also is easily ensured.

INDUSTRIAL APPLICABILITY

A lens assembly according to the present invention is utilized for a microcolumn which is used in an electron beam lithography and in an electron microscope.

The invention claimed is:

1. A method for manufacturing a lens assembly of an electron beam microcolumn having a plurality of microlenses each provided with a hole at a central position thereof, and a plurality of insulating layers alternately interposed between the microlenses, the method comprising:
    forming at least one first microlens assembly set by anodic-bonding an insulating layer and a microlens together so that a part of a surface of the insulating layer is not covered with the microlens;
    layering the first microlens assembly set on a second microlens or a second microlens assembly set while aligning the holes of the microlenses, so that the second microlens or the microlens of the second microlens assembly set is in contact with the insulating layer of the first microlens assembly set, while the part of the insulating layer of the first microlens assembly set not covered by the first microlens is in contact with the second microlens or the microlens of the second microlens assembly set; and
    scanning a laser beam to bond the part of the insulating layer of the first microlens assembly set not covered by the first microlens to the second microlens or the microlens of the second microlens assembly set by passing the laser beam through the part of the insulating layer of the first microlens assembly set, thus welding the first microlens assembly set to the second microlens or the microlens of the second microlens assembly set.

2. The method according to claim 1, wherein the microlens and the insulating layer of each of the microlens assembly sets are anodic-bonded together after the microlens of each of the microlens assembly sets is rotated on the insulating layer around the hole thereof at a predetermined angle.

3. The method according to claim 1, wherein the microlens assembly sets are arranged while rotating the first microlens assembly set on the second microlens assembly set around the holes at a predetermined angle, so that the insulating layer of the first microlens assembly set and the microlens of the second microlens assembly set form a path of the laser beam during the scanning of the laser beam, thus forming a welding spot on both the insulating layer of the first microlens assembly set and the microlens of the second microlens assembly set.

4. The method according to claim 1, wherein each of the holes is circular or polygonal.

5. The method according to claim 1, further comprising: anodic-bonding the microlens assembly sets together after the scanning of the laser beam.

6. The method according to claim 1, wherein the anodic-bonding is executed by bringing a flat plate electrode having a wide contact surface into contact with an upper surface of the microlens.

7. The method according to claim 1, wherein the part of the microlens that is not covered is provided with a wiring connection.

8. A lens assembly manufactured through the method according to claim 1.

9. A lens assembly according to claim 8, wherein the anodic-bonding is executed by bringing a flat plate electrode having a wide contact surface into contact with an upper surface of the microlens, in order to assemble the lens assembly sets.

10. The method according to claim 2, wherein the microlens assembly sets are arranged while rotating the first microlens assembly set on the second microlens assembly set around the holes at a predetermined angle, so that the insulating layer of the first microlens assembly set and the microlens of the second microlens assembly set form a path of the laser beam during the scanning of the laser beam, thus forming a welding spot on both the insulating layer of the first microlens assembly set and the microlens of the second microlens assembly set.

11. The method according to claim 2, wherein each of the holes is circular or polygonal.

12. The method according to claim 2, further comprising: anodic-bonding the microlens assembly sets together after the scanning of the laser beam.

13. The method according to claim 2, wherein the anodic-bonding is executed by bringing a flat plate electrode having a wide contact surface into contact with an upper surface of the microlens.

14. The method according to claim 2, wherein the part of the microlens that is not covered is provided with a wiring connection.

15. A lens assembly manufactured through the method according to claim 2.

16. A lens assembly according to claim 15, wherein the anodic-bonding is executed by bringing a flat plate electrode having a wide contact surface into contact with an upper surface of the microlens, in order to assemble the lens assembly sets.

17. The method according to claim 3, wherein each of the holes is circular or polygonal.

18. The method according to claim 3, further comprising: anodic-bonding the microlens assembly sets together after the scanning of the laser beam.

19. The method according to claim 3, wherein the anodic-bonding is executed by bringing a flat plate electrode having a wide contact surface into contact with an upper surface of the microlens.

20. The method according to claim 4, further comprising: anodic-bonding the microlens assembly sets together after the scanning of the laser beam.

* * * * *